United States Patent
Taira et al.

(10) Patent No.: US 6,410,412 B1
(45) Date of Patent: Jun. 25, 2002

(54) METHODS FOR FABRICATING MEMORY DEVICES

(75) Inventors: Kenichi Taira; Noriyuki Kawashima; Takashi Noguchi; Dharam Pal Gosain; Setsuo Usui, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/663,006

(22) Filed: Sep. 15, 2000

(30) Foreign Application Priority Data

Sep. 16, 1999 (JP) .............................. 11-261969

(51) Int. Cl.⁷ ......................................... H01L 21/4763
(52) U.S. Cl. ....................... 438/594; 438/260; 438/263; 438/927
(58) Field of Search ............................... 438/594, 260, 438/263, 927, 962, 979, 167, 169; 257/317, 321, 324, 315, 322, 326

(56) References Cited

U.S. PATENT DOCUMENTS

| | | | |
|---|---|---|---|
| 5,382,537 A | * | 1/1995 | Noguchi et al. ............... 437/41 |
| 5,403,772 A | * | 4/1995 | Zhang et al. ................ 437/101 |
| 6,118,686 A | * | 9/2000 | Taira et al. .................. 365/129 |
| 6,180,499 B1 | * | 1/2001 | Yu ............................. 438/585 |
| 6,268,273 B1 | * | 7/2001 | Kim et al. .................... 438/594 |
| 6,274,903 B1 | * | 8/2001 | Nomoto et al. ............. 257/317 |
| 6,285,055 B1 | * | 9/2001 | Gosain et al. .............. 257/317 |

\* cited by examiner

*Primary Examiner*—Charles Bowers
*Assistant Examiner*—Laura M Schillinger
(74) *Attorney, Agent, or Firm*—Sonnenschein, Nath & Rosenthal

(57) ABSTRACT

Methods for fabricating memory devices having a multi-dot floating gate ensuring a desirable crystallization of a semiconductor film without ruining the flatness of the surface of the polycrystallized silicon layer and a tunnel oxide film, allowing desirable semiconductor dots to be produced, and allowing production of the memory devices having a multi-dot floating gate with ease and at low costs even when a substrate is made of glass or plastic. Such a method for fabricating memory devices includes steps for forming on a substrate a semiconductor film and treating said semiconductor film by a first laser annealing so as to have a polycrystalline structure; forming on the semiconductor film a semiconductor dot forming film having a non-stoichiometric composition with an excessive content of a semiconductor element; and dispersing semiconductor dots within the semiconductor dot forming film by a second laser annealing thereby to produce semiconductor dots; in which a pulse energy density of the laser used for the first laser annealing is larger than a pulse energy density of the laser used for the second laser annealing.

19 Claims, 9 Drawing Sheets

METHODS FOR FABRICATING MEMORY DEVICES

RELATED APPLICATION DATA

The present application claims priority to Japanese Application No. P11-261969 filed Sep. 16, 1999, which application is incorporated herein by reference to the extent permitted by law.

BACKGROUND OF THE INVENTION

1. Field of the Invention

The present invention relates to methods for fabricating memory devices having a multi-dot floating gate, and in more detail to methods for fabricating memory devices ensuring a desirable crystallization of a semiconductor film without ruining the surface flatness of the polycrystallized silicon layer and a tunnel oxide film, allowing desirable semiconductor dots to be produced, and allowing production of the memory devices having multi-dot floating gate with ease and at low costs even when a substrate is made of glass or plastic.

2. Description of Related Art

In recent years, degree of integration of semiconductor memory devices such as DRAM (dynamic random access memory) and SRAM (static random access memory) keeps on increasing. Such semiconductor memories are the same in-principle in that memory cells thereof are individually composed of transistors, capacitors and the like, the memory cells are connected with each other by wiring through which write operation or read out operation to or from the memory cells are enabled. The semiconductor memories based on such constitution have, however, been suffering from a limited degree of integration.

On the other hand, non-volatile memory devices enabling information read/write operation by light irradiation or application of external electric field principally need no wiring between memory cells thereof, so that they can exempt from limitation on the degree of integration due to wiring and can have a higher degree of integration. As such kind of memory, there is proposed a floating gate MOS (metal oxide semiconductor) memory having a floating gate of the multi-dot type or single dot-type. This floating gate MOS memory is in a full expectation for the future for its long holding time of information.

The conventional floating gate MOS memory is, however, disadvantageous in that it requires a larger cost and longer process time since the silicon dots (silicon thin wires) are formed by photolithography and then shrunk by thermal oxidation (back thermal oxidation) process at high temperatures. The problem also resides in that such heat treatment at high temperatures makes it difficult to fabricate the memory device when the substrate thereof is made of glass or plastic.

The present inventors have proposed in Japanese Patent Application Publication No. 11-274420 a method for fabricating a memory device having a multi-dot floating gate in which an $SiO_2$ film is formed on a substrate, a silicon film is formed on the $SiO_2$ film, and further on the silicon film an Si-excessive non-stoichiometric $SiO_x$ (x<2) is formed, the silicon film is then laser annealed so as to have a polysilicon structure, and at the same time the $SiO_x$ film is decomposed to produce stoichiometric $SiO_2$ and Si, thereby to form silicon dots.

Such method is advantageous in that it can fabricate the memory device having the multi-dot floating gate with ease and at low costs even when the substrate thereof is made of glass or plastic.

In the method disclosed in Japanese Patent Application Publication No. 11-274420, in which the silicon film is converted into the polysilicon film by a single process of the laser annealing, and at the same time the $SiO_x$ film is decomposed to produce stoichiometric $SiO_2$ and Si thereby to obtain the silicon dots, a problem resides in that the surface flatness of the polycrystallized silicon layer undesirably ruined by the laser annealing cannot be recovered, and in that a tunnel oxide film may be damaged due to stress caused by shrinkage during the polycrystallization of silicon and the laser annealing with a high-output laser. It was also observed that the silicon film is not sufficiently polycrystallized while the silicon dots are successfully formed, or on the contrary the silicon film is sufficiently polycrystallized while the silicon dots are destroyed.

SUMMARY OF THE INVENTION

It is therefore an object of the present invention to provide methods for fabricating memory devices having a multi-dot floating gate ensuring a desirable crystallization of a semiconductor film without ruining the surface flatness of the polycrystallized silicon layer and a tunnel oxide film, allowing desirable semiconductor dots to be produced, and allowing production of the memory devices having a multi-dot floating gate with ease and at low costs even when a substrate is made of glass or plastic.

The present inventors found out after extensive investigations that the pulse energy density required for polycrystallizing the silicon layer is larger than that required for producing the silicon dots, and that the forgoing object can be achieved by a method for fabricating a memory device comprising the steps of: forming on a substrate a semiconductor film and treating said semiconductor film by a first laser annealing so as to have a polycrystalline structure; forming on the semiconductor film a semiconductor dot forming film having a non-stoichiometric composition with an excessive content of a semiconductor element; and dispersing semiconductor dots within the semiconductor dot forming film by a second laser annealing thereby to produce semiconductor dots; in which, a pulse energy density of the laser used for the first laser annealing is larger than a pulse energy density of the laser used for the second laser annealing.

According to the present invention, a laser with a high pulse energy density is used in the first laser annealing in which a large laser pulse energy density is required for polycrystallizing the silicon film, and a laser with an pulse energy density lower than that used in the first laser annealing is used in the second laser annealing in which not so large pulse energy density is required for forming the semiconductor dots. Since the laser anneal conditions are optimally selected individually in the first and second laser annealings, the semiconductor film can be polycrystallized in a desired manner, and semiconductor dots can desirably be dispersed within the semiconductor dot forming film to be provided as semiconductor dots. In this process, the tunnel oxide film is successfully prevented from being damaged by stress caused by the polycrystallization of semiconductor or by the laser annealing with a large pulse energy density. When the flatness of the surface of the polycrystallized semiconductor film is not sufficient, a desirable flatness can be obtained by, for example, the CMP (chemical mechanical polishing) process.

The term "non-stoichiometric composition" in the context of the present invention refers to a composition expressed by a component ratio deviated from a stoichiometric one.

The term "semiconductor dots" in the context of the present invention refers to semiconductor dots having diameters within a range from 1 nm to 10 nm.

Examples of the semiconductor dot forming film include silicon dot forming film and germanium dot forming film; examples of such silicon dot forming film include Si-excessive silicon oxide ($SiO_x$) film, and silicon nitride ($SiN_x$) film, and examples of such germanium dot forming film include germanium-excessive germanium oxide ($GeO_x$) film and germanium nitride ($GeN_x$) film.

In the present invention, the first laser annealing is performed using a laser beam with a pulse energy density of 200 to 800 $mJ/cm^2$, more preferably 250 to 550 $mJ/cm^2$, and still more preferably 280 to 450 $mJ/cm^2$.

In the present invention, a laser beam used for the second laser annealing may be selectable depending on the material, thickness and so forth of the semiconductor dot forming film. For a most general semiconductor dot forming film made of $SiO_x$ (x=1.2 to 1.9) and has a thickness of 5 to 50 nm, the laser beam preferably has a pulse energy density of 50 to 500 $mJ/cm^2$, more preferably 80 to 400 $mJ/cm^2$, and still more preferably 100 to 300 $mJ/cm^2$.

In a preferable embodiment of the present invention, the semiconductor dot forming film comprises a semiconductor-excessive oxide film or a nitride film.

In a more preferable embodiment of the present invention, the semiconductor dot forming film has a thickness of 5 to 50 nm, and is made of $SiO_x$ (x=1.2 to 1.9).

In a more preferable embodiment of the present invention, the semiconductor is selected from the group consisting of Si and Ge as Group IV elements, $SiFe_2$ alloy and SiGe alloy as Group IV compound semiconductors, Group II–VI compound semiconductors and Group III–V compound semiconductors.

In a more preferable embodiment of the present invention, the first and second laser annealings are performed by irradiating excimer laser beam.

In a more preferable embodiment of the present invention, the excimer laser is selected from the group consisting of XeCl excimer laser (wavelength=308 nm), KrF excimer laser (wavelength=248 nm), ArF excimer laser (wavelength=193 nm) and ultraviolet pulse YAG solid-state laser.

In a more preferable embodiment of the present invention, the method further includes the step of forming an insulating layer between the substrate and the semiconductor film is further provided.

The foregoing object can also be achieved by a method for fabricating a memory device comprising: the steps of forming on a substrate a semiconductor film affording a channel region and treating said semiconductor film by a first laser annealing so as to have a polycrystalline structure; forming on the semiconductor film a first insulating film and a semiconductor dot forming film having a non-stoichiometric composition with an excessive content of a semiconductor element stacked in this order; dispersing semiconductor dots within the semiconductor dot forming film by a second laser annealing thereby to produce semiconductor dots; forming on the semiconductor dot forming film having the semiconductor dots produced therein a second insulating film and a control gate stacked in this order; selectively removing the second insulating film, the semiconductor dot forming film having the semiconductor dots produced therein, and the first insulating film, using the control gate as a mask, thereby to form a floating gate; and introducing an impurity into the polycrystallized semiconductor film, in the area along both sides of the floating gate thereby to form a source region and a drain region; in which, a pulse energy density of the laser used for the first laser annealing is larger than a pulse energy density of the laser used for the second laser annealing.

DESCRIPTION OF THE PREFERRED EMBODIMENT

The present invention will be detailed hereinafter based on the preferred embodiment referring to the attached drawings.

FIGS. 1 to 12 are schematic sectional views showing process steps of the memory device having the multi-dot floating gate according to a preferred embodiment of the present invention.

Figure 1:
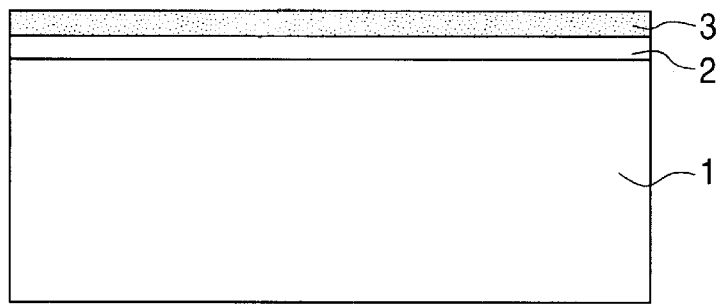
FIG. 1 is a schematic sectional view showing a process step of a memory device having a multi-dot floating gate according to a preferred embodiment of the present invention.

As shown in FIG. 1, on the surface of a quartz substrate 1, an SiO$_2$ film 2 of 200 nm thick is formed by the PECVD (plasma-enhanced chemical vapor deposition) process, and further thereon a hydrogenated amorphous silicon film is formed by the PECVD process and then dehydrogenated, thereby to form an Si film 3 of 30 nm thick.

Figure 2:
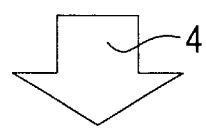
FIG. 2 is a schematic sectional view showing a process step as continued from FIG. 1.
Figure 2:
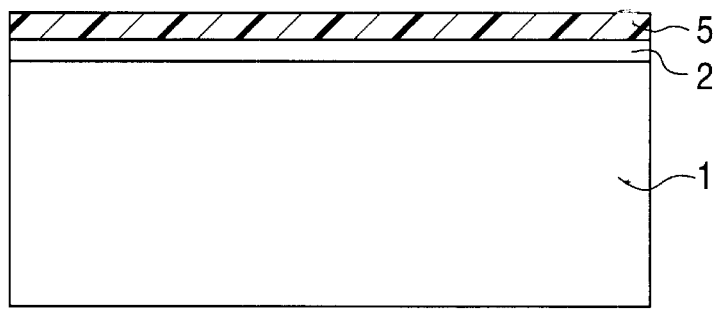

Next, as shown in FIG. 2, XeCl excimer laser beam 4 with a pulse width of 10 to 50 nsec and a pulse energy density of 280 to 450 mJ/cm$^2$ (wavelength=308 nm) is irradiated as much as 100 shots on the surface of the Si film 3, thereby to effect the laser annealing. By such laser annealing, the Si film 3 is polycrystallized and thus a polysilicon film 5 is formed. If the surface flatness of the polysilicon film 5 should be ruined in this process, the surface of the polysilicon film 5 can readily be planarized by, for example, the CMP process since the surface is in an exposed state.

Figure 3:
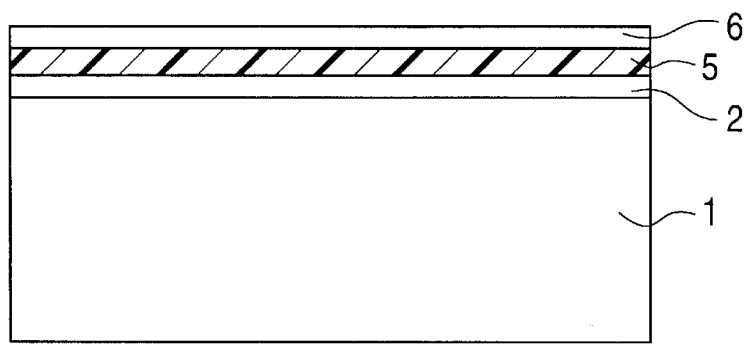
FIG. 3 is a schematic sectional view showing a process step as continued from FIG. 2.

Next, as shown in FIG. 3, a tunnel SiO$_2$ film 6 of 1 to 10 nm thick is formed on the polysilicon film 5 by the PECVD process.

Figure 4:
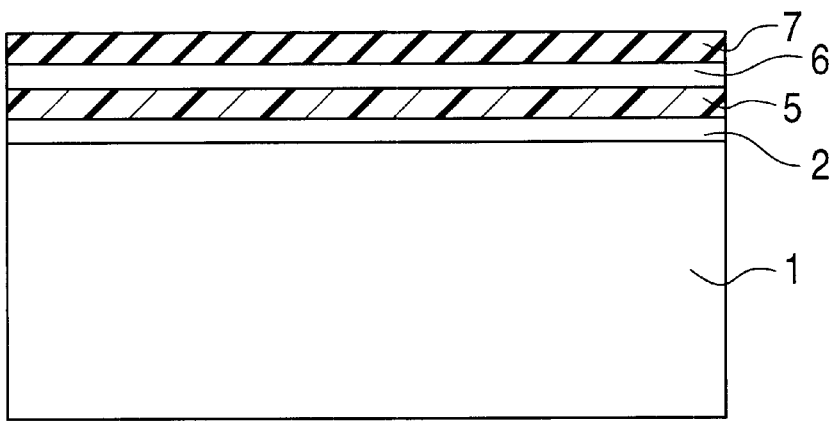
FIG. 4 is a schematic sectional view showing a process step as continued from FIG. 3.

Next, as shown in FIG. 4, on the tunnel SiO$_2$ film 6, a Si-excessive non-stoichiometric SiO$_x$ film 7 (x<1.2 to 1.9) of 5 to 50 nm thick is formed by the PECVD process using SiH$_4$ gas at a flow rate of 10 to 200 SCCM and N$_2$O gas at a flow rate of 15 to 200 SCCM.

Figure 5:
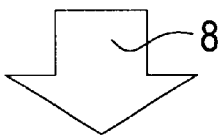
FIG. 5 is a schematic sectional view showing a process step as continued from FIG. 4.
Figure 5:
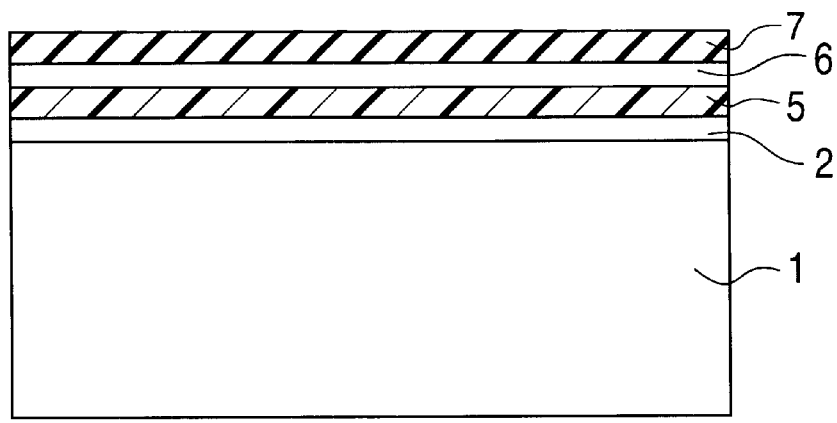

Thereafter, as shown in FIG. 5, XeCl excimer laser beam 8 with a pulse width of 10 to 50 nsec and a pulse energy density of 100 to 300 mJ/cm$^2$ (wavelength=308 nm) is irradiated as much as 100 shots on the surface of the SiO$_x$ film 7, thereby to effect the laser annealing. By such laser annealing, the SiO$_x$ film 7 is decomposed to produce stoichiometric SiO$_2$ and Si. The pulse energy density of the laser beam 8 is so selected as it is smaller than that of the laser beam 4, since the pulse energy density required for decomposing the SiO$_x$ film 7 into stoichiometric SiO$_2$ and Si is smaller than that required for polycrystallizing the silicon film 3. Hence, the irradiation of the laser beam 8 having a smaller pulse energy density than that of the laser beam 4 will not ruin the surface flatness of the polysilicon film 5 nor damage the tunnel SiO$_2$ film 6.

Figure 6:
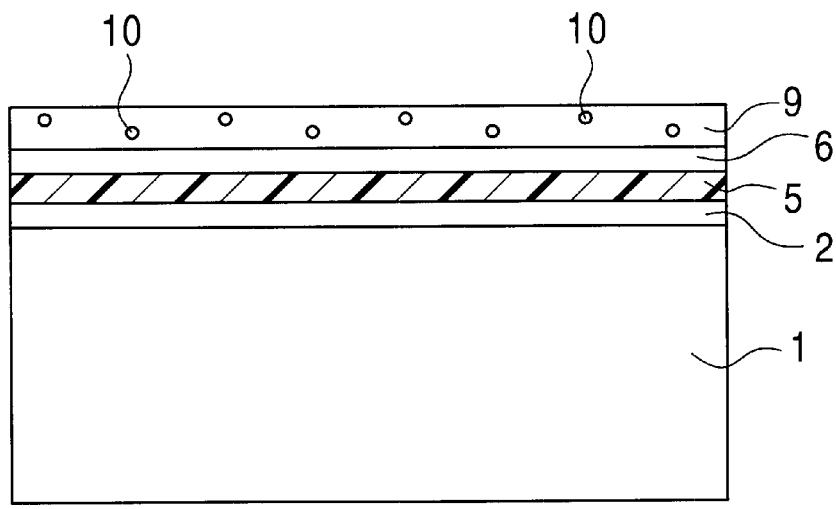
FIG. 6 is a schematic sectional view showing a process step as continued from FIG. 5.

Such decomposition of the SiO$_x$ film 7 into stoichiometric SiO$_2$ and Si results in a status, as shown in FIG. 6, in which accumulation sites comprising Si dots 10 are distributed within an SiO$_2$ film 9, thereby to form the floating gate. The diameter of the Si dots 10 is within a range from 1 nm to 10 nm.

Figure 7:
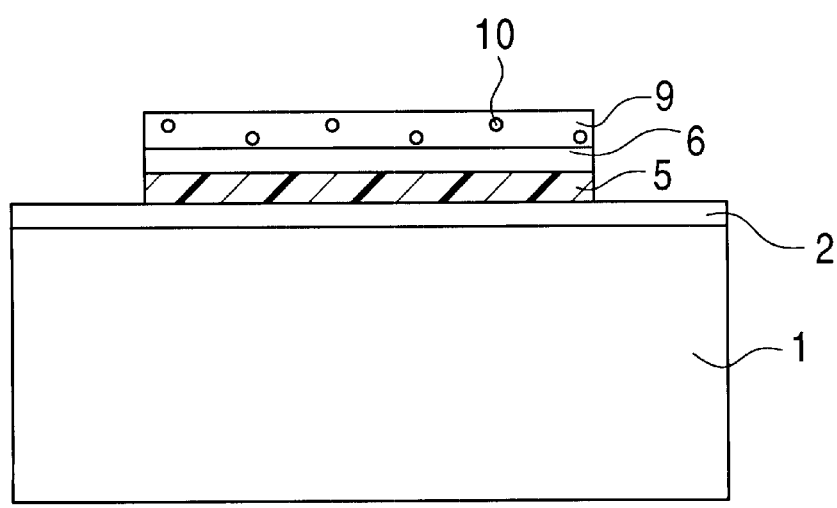
FIG. 7 is a schematic sectional view showing a process step as continued from FIG. 6.

Next, as shown in FIG. 7, parts of the SiO$_2$ film 9, tunnel SiO$_2$ film 6 and polysilicon film 5 are removed by etching.

Figure 8:
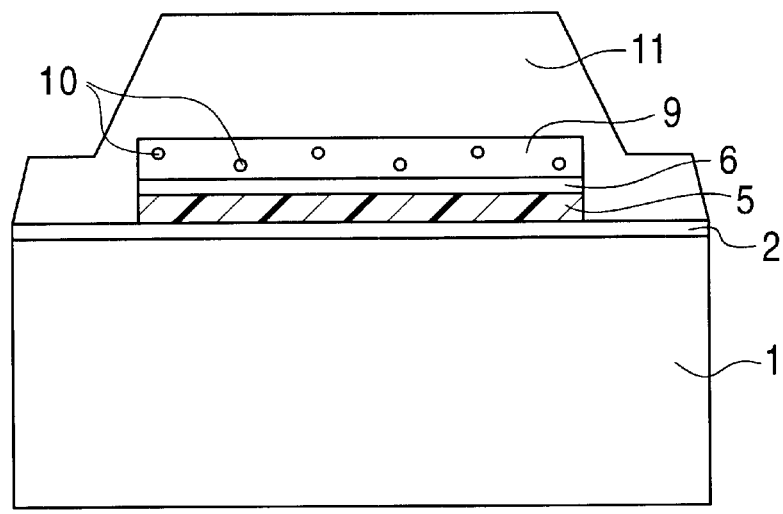
FIG. 8 is a schematic sectional view showing a process step as continued from FIG. 7.

Then as shown in FIG. 8, an SiO$_2$ film 11 is formed by the PECVD process so as to cover the patterned SiO$_2$ film 9, tunnel SiO$_2$ film 6 and polysilicon film 5.

Figure 9:
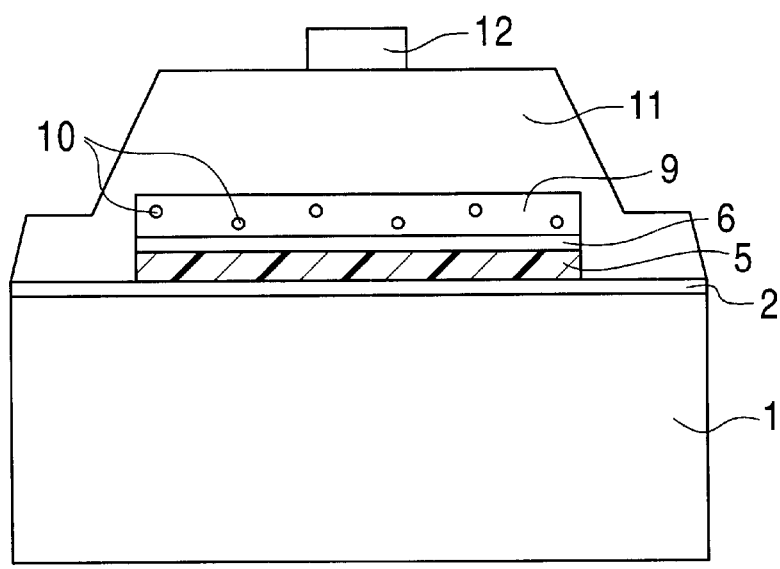
FIG. 9 is a schematic sectional view showing a process step as continued from FIG. 8.

Further as shown in FIG. 9, aluminum is evaporated on the surface of the SiO$_2$ film 11 thereby to form an aluminum film, which was then processed into a control gate 12.

Figure 10:
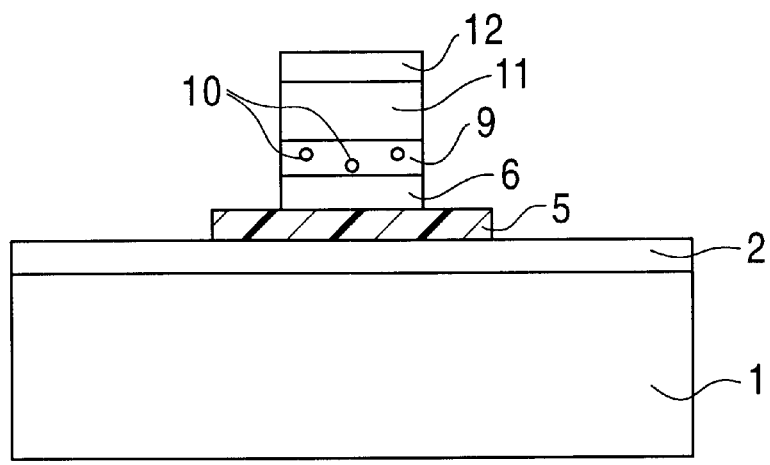
FIG. 10 is a schematic sectional view showing a process step as continued from FIG. 9.

Next, as shown in FIG. 10, etching was performed using the control gate 12 as an etching mask, thereby to pattern the SiO$_2$ film 11, SiO$_2$ film 9, and tunnel SiO$_2$ film 6.

Figure 11:
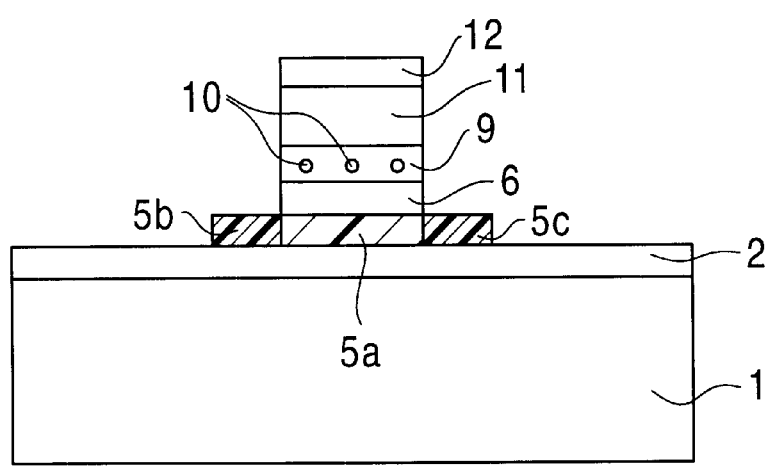
FIG. 11 is a schematic sectional view showing a process step as continued from FIG. 10.

Next, as shown in FIG. 11, an n-type impurity (phosphorus) is doped by plasma doping using a PH$_3$ plasma into the silicon film 5 masked with the control gate 12. Thus on both sides of a conductive region 5a beneath the control gate 12 a first impurity-containing region 5b and a second impurity-containing region 5c are formed in a self-aligned manner.

Figure 12:
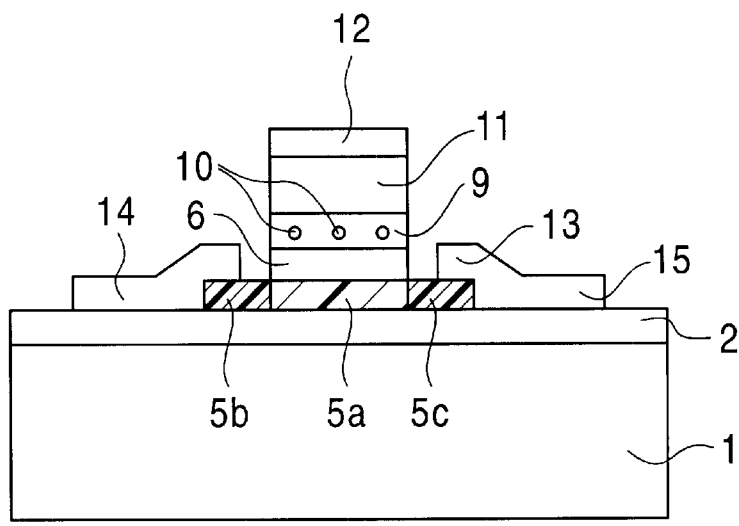
FIG. 12 is a schematic sectional view showing a process step as continued from FIG. 11.

Next, as shown in FIG. 12, an aluminum film 13 is evaporated and is then patterned to form a source electrode 14 and a drain electrode 15.

Figure 13:
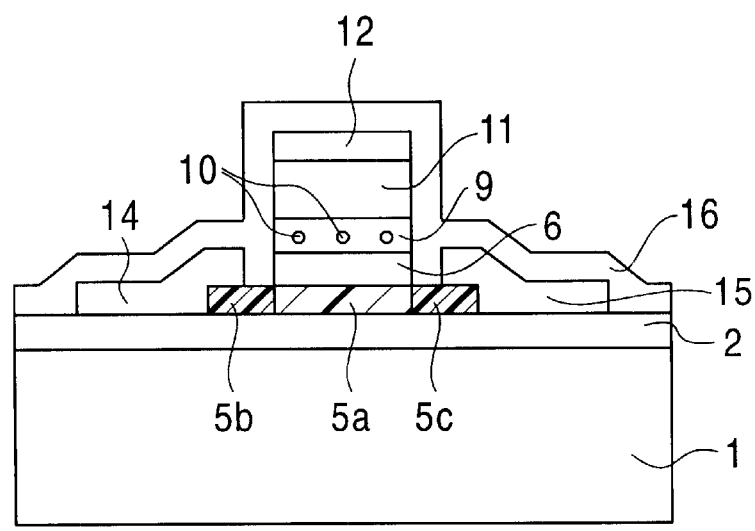
FIG. 13 is a schematic sectional view showing a process step as continued from FIG. 12.

Further as shown in FIG. 13, an Si$_3$N$_4$ film 16 as a protective film is formed by the PECVD process.

Figure 14:
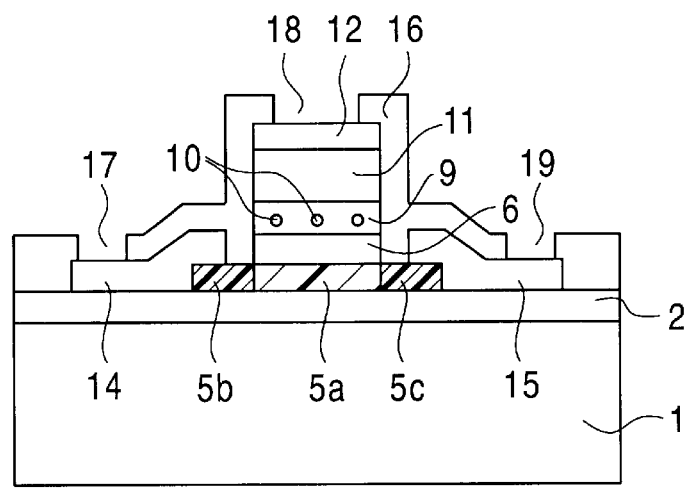
FIG. 14 is a schematic sectional view showing a process step as continued from FIG. 13.

Next, as shown in FIG. 14, a contact hole 17 for the source contact, a contact hole 18 for the gate contact and a contact hole 19 for the drain contact are formed to the Si$_3$N$_4$ film 16.

According to such processes,.a non-volatile memory device having a floating gate containing the Si dots can be fabricated.

In thus obtained non-volatile memory device having a floating gate containing the Si dots, when electric current flows between the first impurity-containing region 5b and the second impurity-containing region 5c, applying a large positive bias to the conductive region 5a through the control gate 12 will allow electrons to pass through the SiO$_2$ film 6 by the tunnel effect to be accumulated in the Si dots 10, thereby to cause changes in the I–V characteristic. On the contrary, applying a negative bias to the control gate 12 will allow electrons accumulated in the Si dots 10 to pass through the SiO$_2$ film 6 by the tunnel effect to be emitted into the conductive region 5a, thereby to recover the initial I–V characteristic. As is clear from the above, the Si dots formed in the gate insulating film can accumulate and release electric charges, thereby to exert a memory effect. While such constitution allows the same function as so-called flash memory having a silicon floating gate with a continuous structure, the dot-type floating gate can ensure the memory device an excellent charge retaining property since electric charge accumulated in the individual dots is not likely to leak and dissipate.

According to such embodiment, the Si film 3 is polycrystallized by the laser annealing in which the surface thereof is irradiated by the XeCl excimer laser beam 4 (wavelength= 308 nm) with a pulse width of 10 to 50 nsec and a pulse energy density of 280 to 450 mJ/cm$^2$ as much as 100 shots to have the polysilicon film 5; and on the other hand, the Si dots 10 as the accumulation sites of the floating gate are formed by the laser annealing in which the Si-excessive non-stoichiometric SiO$_x$ film 7 (x=1.2 to 1.9) of 5 to 50 nm thick is irradiated by the XeCl excimer laser beam 8 (wavelength=308 nm) with a pulse width of 10 to 50 nsec and a pulse energy density of 100 to 300 mJ/cm$^2$ as much as 100 shots thereby to decompose the SiOx film 7 into stoichiometric SiO$_2$ and Si, which provides the SiO$_2$ film 9 and Si dots 10 distributed therein as the accumulation sites of the floating gate. That is, in the polycrystallization of the Si film 3 which requires the laser annealing at a high pulse energy density, the XeCl excimer laser beam 4 (wavelength= 308 nm) with a pulse energy density as large as 280 to 450 mJ/cm$^2$ is employed; and in the formation of the Si dots 10 which requires the laser annealing at a not so high pulse energy density as the Si film 3, the XeCl excimer laser beam 8 with a pulse energy density as small as 100 to 300 mJ/cm$^2$ is employed. Since the laser anneal conditions are thus optimally selected for the individual annealings, the Si film 3 can be polycrystallized in a desired manner, and the Si—excessive non-stoichiometric SiO$_x$ film 7 (x=1.2 to 1.9) is decomposed into stoichiometric SiO$_2$ and Si thereby to provide the SiO$_2$ film 9 and accumulation sites comprising the Si dots 10 distributed therein. Hence, the semiconductor dots can successfully formed as the Si dots 10 as being distributed within the SiO$_2$ film 9 to provide the floating gate, while the Si film 3 is polycrystallized as desired, and the tunnel SiO$_2$ film 6 is successfully prevented from being damaged by stress caused by the polycrystallization of Si or by the laser annealing with a large pulse energy According to such embodiment, the surface of the polysilicon film 5 even in the state of lacking flatness can readily be planarized by the CMP process, since the surface is in an exposed state.

EXAMPLE

To further clarify the effects of the present invention, Example and Comparative Example will be explained hereinafter.

Example

On the surface of a quartz substrate of 500 μm thick, an $SiO_2$ film of 200 nm thick was formed by the PECVD process.

Next, a hydrogenated amorphous silicon film was formed on the $SiO_2$ film by the PECVD process, and then dehydrogenated by keeping the film within a vacuum chamber conditioned at $10^{-6}$ Torr and 400° C. for 2 hours, thereby to form an Si film of 30 nm thick.

Next, XeCl excimer laser beam with a pulse width of 30 nsec and a pulse energy density of 300 $mJ/cm^2$ (wavelength=308 nm) was irradiated as much as 100 shots on the surface of the Si film, thereby to effect the laser annealing. By such laser annealing, the Si film was polycrystallized and thus a polysilicon film was formed.

Next, a tunnel $SiO_2$ film of 10 nm thick was formed on the polysilicon film by the PECVD process.

Next, on the tunnel $SiO_2$ film, a Si-excessive non-stoichiometric $SiO_x$ film (x=1.59) was formed by the PECVD process using $SiH_4$ gas at a flow rate of 10 SCCM and $N_2O$ gas at a flow rate of 200 SCCM.

Thereafter, XeCl excimer laser beam with a pulse width of 30 nsec and a pulse energy density of 190 $mJ/cm^2$ (wavelength=308 nm) was irradiated as much as 100 shots on the surface of the $SiO_x$ film, thereby to effect the laser annealing.

By such laser annealing, the $SiO_x$ film was decomposed to produce stoichiometric $SiO_2$ and Si, and the accumulation sites comprising the Si dots of 1 nm to 10 nm diameter were produced as being distributed within the $SiO_2$ film, thereby to form the floating gate.

Next, parts of the $SiO_2$ film, tunnel $SiO_2$ film and polysilicon film were removed by etching, and an $SiO_2$ film is formed by the PECVD process so as to cover the patterned $SiO_2$ film, tunnel $SiO_2$ film and polysilicon film.

Next, aluminum was evaporated on the surface of the $SiO_2$ film, and was then patterned into a control gate.

Next, etching was performed using the control gate as an etching mask, thereby to pattern the $SiO_2$ films, and tunnel $SiO_2$ film.

Next, an n-type impurity (phosphorus) was doped by plasma doping using a $PH_3$ plasma into the silicon film masked with the control gate. Thus on both sides of a conductive region a first impurity-containing region and a second impurity-containing region were formed in a self-aligned manner.

Next, an aluminum film of 200 nm thick was evaporated and is then patterned to form a source electrode and a drain electrode, and thereafter, an $Si_3N_4$ film as a protective film was formed by the PECVD process. Next, a contact hole for the source contact, a contact hole for the gate contact and a contact hole for the drain contact were formed to the $Si_3N_4$ film, thereby to obtain a memory device having a floating gate, which was referred to as Sample #1.

Comparative Example

A Si film of 30 nm thick was formed on the surface of a quartz substrate, which was followed by, without subjecting the Si film to the laser annealing, the formation of a tunnel $SiO_2$ film of 10 nm thick on the surface of the Si film by the PECVD process, and the formation of a Si-excessive non-stoichiometric SiOx film (x=1.59) on the surface of the tunnel $SiO_2$ film by the PECVD process using $SiH_4$ gas at a flow rate of 10 SCCM and $N_2O$ gas at a flow rate of 200 SCCM. Thereafter, a memory device having the floating gate was obtained in a similar manner except that the laser annealing was performed using XeCl excimer laser beam with a pulse width of 20 nsec and a pulse energy density of 280 $mJ/cm^2$ (wavelength=308 nm) was irradiated as much as 100 shots on the surface of the SiOx film. The obtained memory device was referred to as Sample #2.

Thus obtained Sample #1 and Sample #2 were examined for the characteristics below.

1. $V_g$-$I_d$ Characteristics

Figure 15:
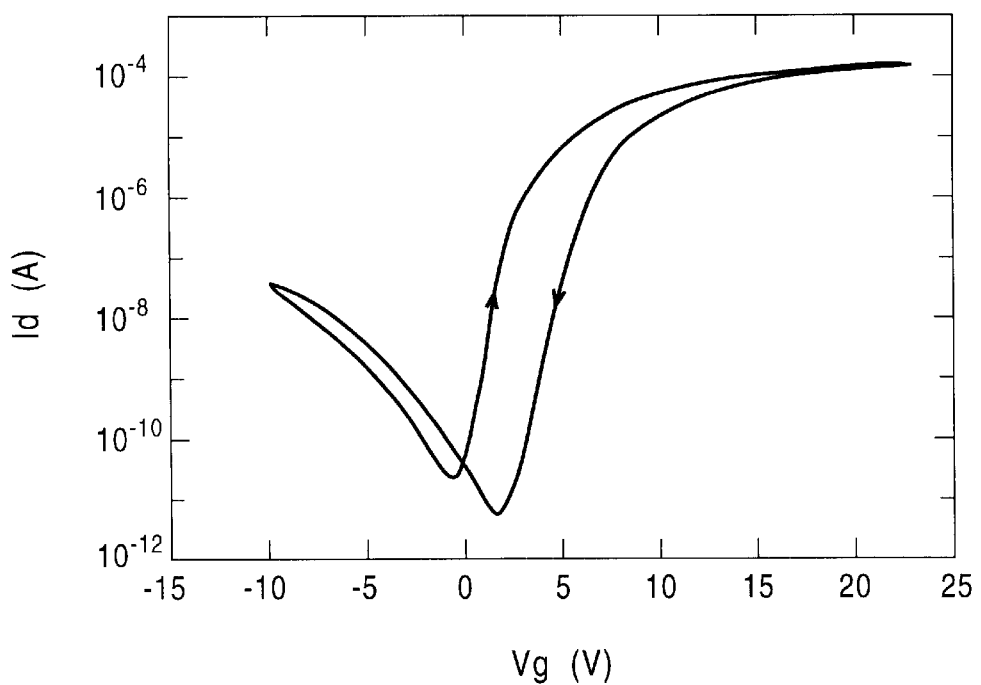
FIG. 15 is a graph showing a measured result of the current $I_d$ flowing through the channel in relation to the gate voltage $V_g$ for Sample #1.
Figure 16:
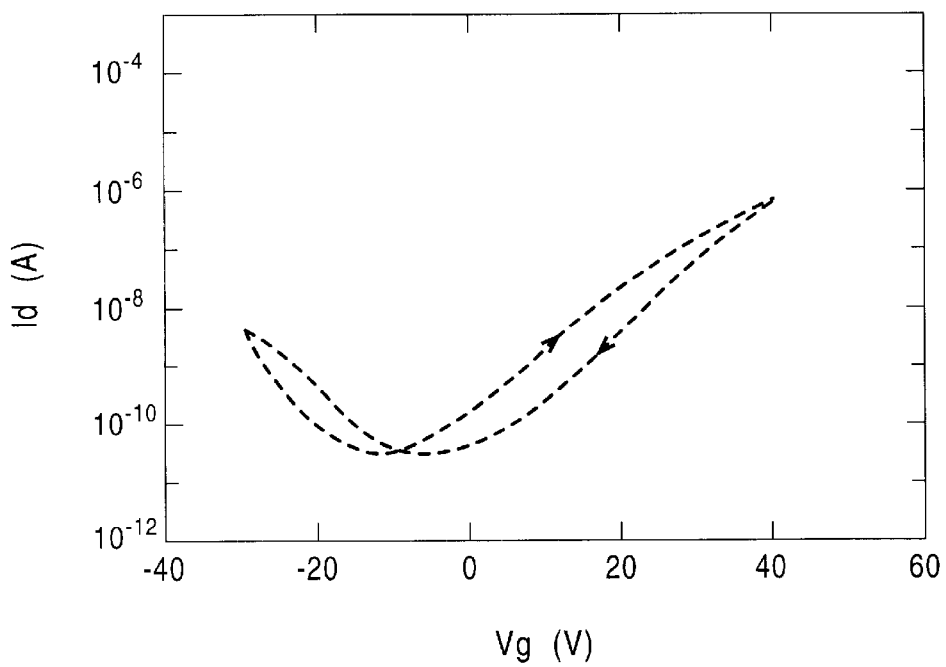
FIG. 16 is a graph showing a measured result of the current $I_d$ flowing through a channel in relation to the gate voltage $V_g$ for Sample #2.

Changes in the current $I_d$ flowing through the channel of Sample #1 and Sample #2 in response to changes in the gate voltage $V_g$ were measured, which gave the results shown in FIG. 15 and FIG. 16, respectively.

From the results shown in FIGS. 15 and 16, Sample #1 according to Example of the present invention was found to be significantly improved in "increment of $I_d$/increment of $V_g$," as compared with that of Sample #2 according to Comparative Example, which indicates a significant improvement in the state of the boundary between the polysilicon film and the tunnel $SiO_2$ film. Hence the Sample #1 according to Example of the present invention can reduce the power consumption to a larger degree than Sample #2 according to the Comparative Example can.

2. Holding Time Characteristics

Figure 17:
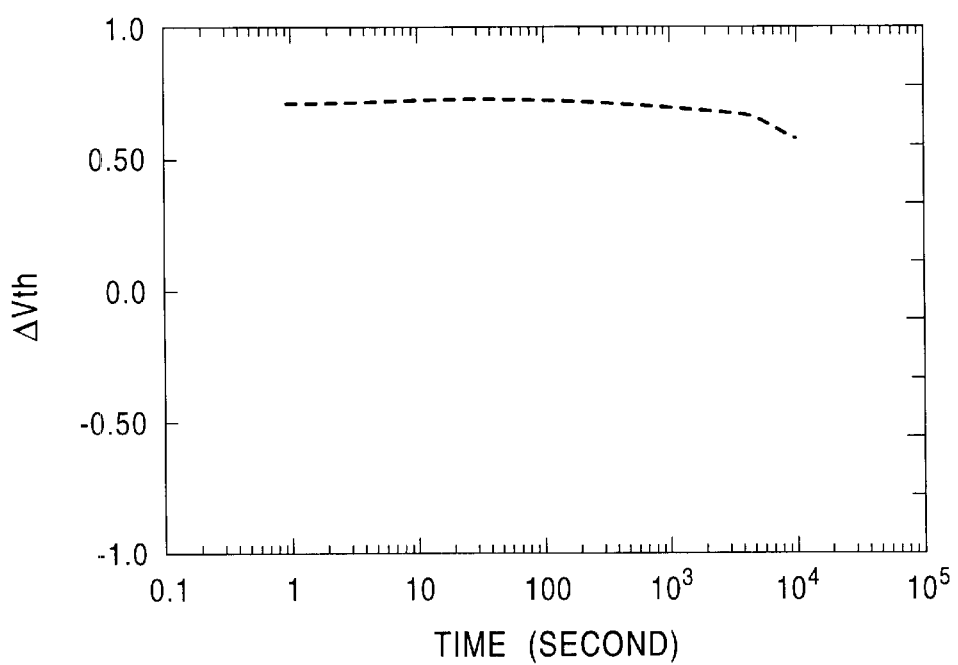
FIG. 17 is a graph showing a measured result of variation $\Delta V_{th}$ of the gate voltage $V_g$ at the time the current $I_d$ flowing through the channel starts to increase due to charge leakage from the floating gate after the write operation for Sample #1.
Figure 18:
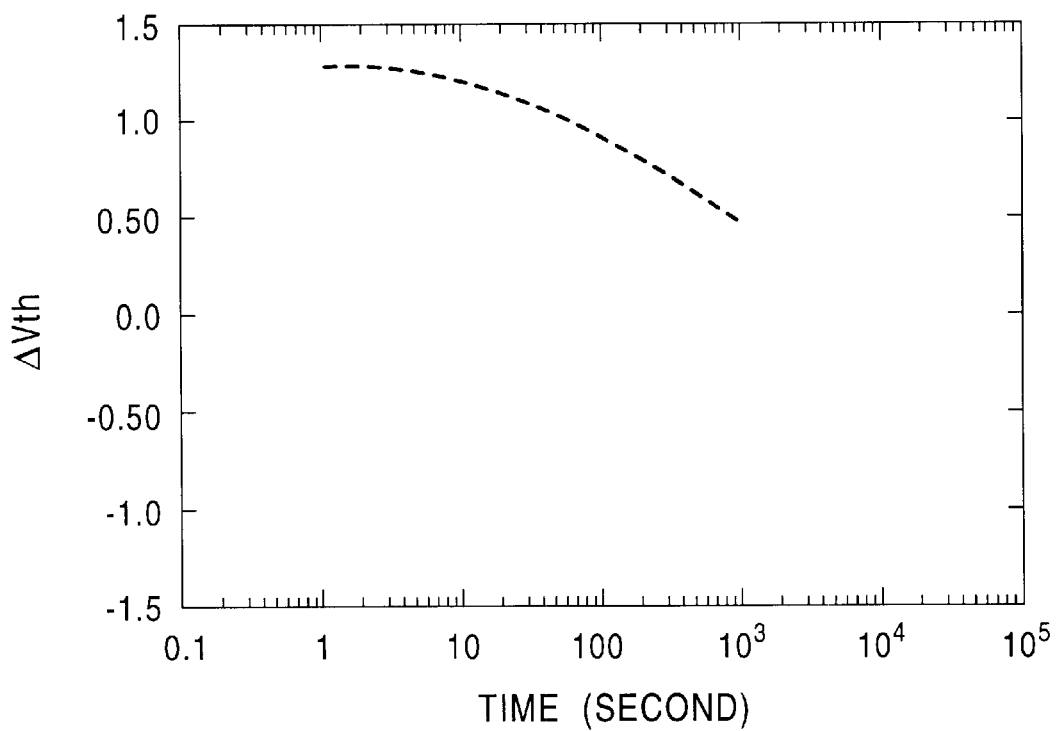
FIG. 18 is a graph showing a measured result of variation $\Delta V_{th}$ of the gate voltage $V_g$ at the time the current $I_d$ flowing through the channel starts to increase due to charge leakage from the floating gate after the write operation for Sample #2.

Variation $\Delta V_{th}$ of the gate voltage $V_g$ at the time the current $I_d$ flowing through the channel starts to increase due to charge leakage from the floating gate after the write operation was measured for Sample #1 and Sample #2, respectively, which yielded the results shown in FIG. 17 and FIG. 18.

From the results shown in FIGS. 17 and 18, Sample #1 according to Example of the present invention was found to keep an almost constant $\Delta V_{th}$ over a long period, and has an improved film quality of the tunnel $SiO_2$ film as compared with that in Sample #2.

It is to be understood that the present invention is by no means limited to the foregoing embodiment and Example, and it is intended to cover all modifications without departing from the scope of the appended Claims.

For example, while the quartz substrate 1 was employed as a substrate in the foregoing embodiment and Example, the substrate is not limitative thereto and the available examples include a glass substrate; a plastic substrates such as made of, polyether sulfone (PES), polymethyl methacrylate or a polyethylene terephthalate; and silicon wafer.

While the $SiO_2$ film 2 was formed on the quartz substrate 1 in the foregoing embodiment and Example, an $Si_{1-x}N_x$ film (x=0 to 4/3) may be formed in place of the $SiO_2$ film 2, or the $SiO_2$ film 2 may be omissible.

While XeCl excimer laser with a wavelength of 308 nm was employed in the foregoing embodiment and Example, other excimer laser such as KrF (wavelength=248 nm) and ArF (wavelength=193 nm) may be used in place of XeCl excimer laser.

While the surface of the Si film 3 was irradiated with the XeCl excimer laser beam 4 (wavelength=308 nm) with a pulse energy density of 280 to 450 $mJ/cm^2$ in the foregoing embodiment, using such beam is not always necessary and using a laser beam 4 having a pulse energy density of 250 to 550 $mJ/cm^2$, or 200 to 800 $mJ/cm^2$ is also allowable.

While the surface of the SiOx film 7 (x=1.2 to 1.9) of 5 to 50 nm thick was irradiated with the XeCl excimer laser beam 8 (wavelength=308 nm) with a pulse energy density of 100 to 300 mJ/cm² in the foregoing embodiment, using such beam is not always necessary and using a laser beam 8 having a pulse energy density of 80 to 400 mJ/cm², or 50 to 500 mJ/cm² is also allowable.

While Si was used as a semiconductor in the foregoing embodiment and Example, any of Ge as a Group IV element, SiFe₂ alloy and SiGe alloy as Group IV compound semiconductors, Group II–VI compound semiconductors and Group III–V compound semiconductors is also available.

While the Si-excessive non-stoichiometric SiOx film 7 (x=1.2 to 1.9) of 5 to 50 nm thick was used in the foregoing embodiment and Example, it may be replaced with an SiOx film 7 (x<2) of a predetermined thickness, or with a semiconductor-excessive oxide film or nitride film.

What is claimed is:

1. A method for fabricating a memory device comprising the steps of:

forming on a substrate a semiconductor film and treating said semiconductor film by a first laser annealing so as to have a polycrystalline structure;

forming on the semiconductor film a semiconductor dot forming film having a non-stoichiometric composition with an excessive content of a semiconductor element; and dispersing semiconductor dots within the semiconductor dot forming film by a second laser annealing thereby to produce semiconductor dots;

in which, a pulse energy density of the laser used for the first laser annealing is larger than a pulse energy density of the laser used for the second laser annealing.

2. The method for fabricating a memory device as claimed in claim 1, wherein the first laser annealing is performed using a laser beam with a pulse energy density of 200 to 800 mJ/cm² and the second laser annealing is performed using a laser beam with a pulse energy density of 50 to 500 mJ/cm².

3. The method for fabricating a memory device as claimed in claim 2, wherein the first laser annealing is performed using a laser beam with a pulse energy density of 250 to 550 mJ/cm² and the second laser annealing is performed using a laser beam with a pulse energy density of 80 to 400 mJ/cm².

4. The method for fabricating a memory device as claimed in claim 3, wherein the first laser annealing is performed using a laser beam with a pulse energy density of 280 to 450 mJ/cm² and the second laser annealing is performed using a laser beam with a pulse energy density of 100 to 300 mJ/cm².

5. The method for fabricating a memory device as claimed in claim 1, wherein the semiconductor dot forming film is an oxide film or a nitride film excessive in the semiconductor content.

6. The method for fabricating a memory device as claimed in claim 2, wherein the semiconductor dot forming film has a thickness of 5 to 50 nm, and is made of $SiO_x$ (x=1.2 to 1.9).

7. The method for fabricating a memory device as claimed in claim 1, wherein the semiconductor is selected from the group consisting of Si and Ge as Group IV elements, SiFe₂ alloy and SiGe alloy as Group IV compound semiconductors, Group II–VI compound semiconductors and Group III–V compound semiconductors.

8. The method for fabricating a memory device as claimed in claim 1, wherein the first and second laser annealings are performed by irradiating excimer laser beam.

9. The method for fabricating a memory device as claimed in claim 8, wherein the excimer laser is selected from the group consisting of XeCl excimer laser (wavelength=308 nm), KrF excimer laser (wavelength=248 nm), ArF excimer laser (wavelength=193 nm) and ultraviolet pulse YAG solid-state laser.

10. The method for fabricating a memory device as claimed in claim 1, further including the step of forming an insulating layer between the substrate and the semiconductor film.

11. A method for fabricating a memory device comprising the steps of:

forming on a substrate a semiconductor film affording a channel region and treating said semiconductor film by a first laser annealing so as to have a polycrystalline structure;

forming on the semiconductor film a first insulating film and a semiconductor dot forming film having a non-stoichiometric composition with an excessive content of a semiconductor element stacked in this order;

dispersing semiconductor dots within the semiconductor dot forming film by a second laser annealing thereby to produce semiconductor dots;

forming on the semiconductor dot forming film having the semiconductor dots produced therein a second insulating film and a control gate stacked in this order;

selectively removing the second insulating film, the semiconductor dot forming film having the semiconductor dots produced therein, and the first insulating film, using the control gate as a mask, thereby to form a floating gate; and introducing an impurity into the polycrystallized semiconductor film, in the area along both sides of the floating gate thereby to form a source region and a drain region;

in which, a pulse energy density of the laser used for the first laser annealing is larger than a pulse energy density of the laser used for the second laser annealing.

12. The method for fabricating a memory device as claimed in claim 11, wherein the first laser annealing is performed using a laser beam with a pulse energy density of 200 to 800 mJ/cm² and the second laser annealing is performed using a laser beam with a pulse energy density of 50 to 500 mJ/cm².

13. The method for fabricating a memory device as claimed in claim 12, wherein the first laser annealing is performed using a laser beam with a pulse energy density of 250 to 550 mJ/cm² and the second laser annealing is performed using a laser beam with a pulse energy density of 80 to 400 mJ/cm².

14. The method for fabricating a memory device as claimed in claim 13, wherein the first laser annealing is performed using a laser beam with a pulse energy density of 280 to 450 mJ/cm² and the second laser annealing is performed using a laser beam with a pulse energy density of 100 to 300 mJ/cm².

15. The method for fabricating a memory device as claimed in claim 11, wherein the semiconductor dot forming film is an oxide film or a nitride film excessive in the semiconductor content.

16. The method for fabricating a memory device as claimed in claim 12, wherein the semiconductor dot forming film has a thickness of 5 to 50 nm, and is made of $SiO_x$ (x=1.2 to 1.9).

17. The method for fabricating a memory device as claimed in claim 11, wherein the semiconductor is selected from the group consisting of Si and Ge as Group IV elements, $SiFe_2$ alloy and SiGe alloy as Group IV compound semiconductors, Group II–VI compound semiconductors and Group III–V compound semiconductors.

18. The method for fabricating a memory device as claimed in claim 11, wherein the first and second laser annealings are performed by irradiating excimer laser beam.

19. The method for fabricating a memory device as claimed in claim 18, wherein the excimer laser is selected from the group consisting of XeCl excimer laser (wavelength=308 nm), KrF excimer laser (wavelength=248 nm), ArF excimer laser (wavelength=193 nm) and ultraviolet pulse YAG solid-state laser.

* * * * *